United States Patent [19]

Ling

[11] Patent Number: 5,739,726
[45] Date of Patent: Apr. 14, 1998

[54] HIGH-SPEED VOLTAGE CONTROLLED OSCILLATOR HAVING A LEVEL SHIFTER FOR PROVIDING RAIL-TO-RAIL OUTPUT

[75] Inventor: Kuok Y. Ling, Austin, Tex.

[73] Assignee: Advanced Micro Devices, Inc., Sunnyvale, Calif.

[21] Appl. No.: 754,503

[22] Filed: Nov. 19, 1996

Related U.S. Application Data

[62] Division of Ser. No. 487,251, Jun. 13, 1995, Pat. No. 5,585,764.

[51] Int. Cl.[6] .................. H03B 5/04; H03K 19/0185; H03L 5/00
[52] U.S. Cl. .................. 331/57; 326/81; 327/333
[58] Field of Search .................. 327/333; 326/81; 331/57

[56] References Cited

U.S. PATENT DOCUMENTS

| 4,633,192 | 12/1986 | Anami | 330/277 |
|---|---|---|---|
| 4,920,284 | 4/1990 | Denda | 326/74 |
| 5,113,097 | 5/1992 | Lee | 326/81 |
| 5,469,080 | 11/1995 | Son | 326/81 |

FOREIGN PATENT DOCUMENTS

| 0 361 529 A2 | 4/1990 | European Pat. Off. |
| 0 496 440 A1 | 7/1992 | European Pat. Off. |
| 0 523 854 A2 | 1/1993 | European Pat. Off. |
| 60-128709 | 7/1985 | Japan |

OTHER PUBLICATIONS

Maneatis, John G., et al., "Precise Delay Generation Using Coupled Oscillators," *Journal of Solid-State Circuits*, Dec. 28, 1993, No. 12, New York, US, p. 1273–1282.

*Primary Examiner*—Siegfried H. Grimm
*Attorney, Agent, or Firm*—Kevin L. Daffer; Lawrence J. Merkel; Conley, Rose & Tayon

[57] ABSTRACT

A voltage controlled oscillator circuit with a high power supply rejection ratio incorporates a clamping transistor with respect to each output terminal which limits the signal swing of the output terminal. The limited voltage swing allows relatively large movements in the power supply and ground voltages without causing significant changes in the frequency of the output signals. Such an oscillator circuit may be incorporated into an integrated circuit characterized by noisy power supply and ground conductors. Additionally, multiple delayed versions of the output frequency may be created using a level shifter circuit and a buffer circuit. The oscillator circuit is relatively quick to react to changes in the controlling voltage, adjusting the oscillation frequency in a relatively short time interval.

7 Claims, 2 Drawing Sheets

HIGH-SPEED VOLTAGE CONTROLLED OSCILLATOR HAVING A LEVEL SHIFTER FOR PROVIDING RAIL-TO-RAIL OUTPUT

This is a Division of application Ser. No. 08/487,251 filed Jun. 13, 1995 and now U.S. Pat. No. 5,585,764.

BACKGROUND OF THE INVENTION

1. Field of the Invention

This invention relates to the field of voltage-controlled oscillators and, more particularly, to voltage-controlled oscillators used on integrated circuits with both analog and digital circuits.

2. Description of the Relevant Art

Integrated circuits are used in a wide variety of applications including computer systems, personal information devices such as cellular phones and electronic organizers, and automobile electronic control systems. As used herein, the term "integrated circuit" refers to any electronic device which embodies a predetermined set of functions upon a single monolithic substrate.

Integrated circuits may be fabricated in different semiconductor technologies. The selection of a particular semiconductor technology with which to fabricate a particular integrated circuit depends on many factors. The semiconductor technologies available when designing the particular integrated circuit in many ways dictate how the circuit will perform. The cost involved in fabricating the integrated circuit also determines circuit operability given the limited resources in many wafer fabrication sites. Considerations related to the application for which the integrated circuit is designed, such as operable temperature ranges and power consumption constraints imposed by circuit application may also affect the choice of semiconductor technology.

Complimentary metal-oxide-semiconductor (CMOS) technology is a particularly popular semiconductor technology for many applications. Two types of transistors may be formed in a CMOS process: PMOS transistors and NMOS transistors. PMOS transistors and NMOS transistors have four terminals (or connection points): a gate terminal, a source terminal, a drain terminal, and a bulk terminal. Electric current flows from the source terminal to the drain terminal of a transistor when a voltage applied to the gate terminal has either a higher or lower value then the voltage applied to the source terminal, depending on the transistor type. A PMOS transistor is a transistor in which current flows if the voltage applied to the gate terminal is lower than the voltage applied to the source terminal. An NMOS transistor is a transistor in which current flows if the voltage applied to the gate terminal is higher than the voltage applied to the source terminal. The bulk terminal is connected either to the source terminal of the transistor or to a proper bias voltage.

In both the PMOS transistor and NMOS transistor, the difference in voltage between the gate terminal and the source terminal must be larger in absolute value than a certain voltage before current flow begins. This certain voltage is referred to as a "threshold" voltage and is the voltage required to form an energized channel between the source and the drain diffusion regions in the PMOS transistor or NMOS transistor. As will be appreciated by those skilled in the art, a transistor is formed on a substrate by diffusing impurities into two regions (a drain diffusion region and a source diffusion region). The two regions are separated by a distance of undiffused substrate material called a channel, over which the gate terminal is constructed. By applying a voltage to the gate terminal of the transistor, the channel is energized such that current may flow between the source diffusion region and the drain diffusion region.

Modern CMOS integrated circuits are being implemented as "mixed signal" devices. In a mixed signal device, both analog and digital signals are used. Analog signals are signals which are continuously variable. They may assume any voltage within a certain voltage range. Digital signals are signals which convey a discrete number of voltages. Transitions between the discrete voltages are well-defined and sharp (i.e. of very short duration), whereas analog signal transitions may be more gradual in some circumstances.

A particular analog device which is often incorporated into integrated circuits is a phase-locked loop (PLL). PLL's are used to provide an internal clock signal which oscillates at a frequency which is a multiple of an externally supplied clock signal. Furthermore, the internal clock signal is "in-phase" (or phase-locked) to the externally supplied clock signal. The internal clock signal is said to be phase-locked if a signal resulting from dividing the internal clock signal by the aforementioned multiple oscillates in synchronization with the externally supplied clock signal. When the internal clock signal and the externally supplied clock signal are phase-locked, the PLL is said to be in a steady state condition. During times in which the PLL is not in steady state (such as power up, for example), the PLL requires a finite amount of time to phase-lock the internal clock signal to the externally supplied clock signal.

PLL's are well-known and generally comprise a phase comparator/detector, a low-pass filter, a voltage-controlled oscillator (VCO) and a clock divider. As used herein, the term "oscillator" refers to a device which produces an output signal which varies (or oscillates) in a pattern. The pattern repeats at regular intervals and is therefore said to have a frequency. The frequency is inversely proportional to the regular interval. The VCO is an oscillator whose output signal oscillates at a frequency controlled by an input voltage to the VCO. in other words, the output frequency from the VCO is proportional to the input voltage applied to the VCO.

Before digital integrated circuits were equipped with PLL's and other analog circuits, they were purely digital devices. Digital circuits were designed in which one of the power supplies was connected to the substrate. For example, in an N-well process in which a P-type substrate is used, the Vss (or ground) power supply is connected to the substrate. The substrate has a resistance associated with it. Therefore, switching currents which flow to the ground power supply may cause voltage differences across the substrate. Furthermore, switching currents for digital circuits are quite high since digital signals are characterized by sharp transitions. In order to quickly charge or discharge a capacitive circuit, large currents are often required. For example, hundreds of milliamps or more are common switching currents in modern integrated circuits which contain digital circuits. Even if the substrate resistance is quite low, the voltage differences may be significant.

Substrate voltage differences caused by digital switching currents are of particular importance to analog circuits embodied on the same substrate as the digital circuits. If the ground voltage that a particular transistor is exposed to is different than the ground voltage of a nearby transistor, then a signal input to the two transistors will cause one of the transistors to begin conducting current before the other transistor. This phenomena occurs because the signal exceeds a threshold voltage at the first transistor before the signal exceeds a threshold voltage at the second transistor. Therefore, the "switch point" of the circuit (i.e. the input voltage level at which the circuit transitions from one value to another) changes as a function of the variance in the power supply values across the substrate. Switch point movement, in the case of an oscillator circuit, causes the oscillating output signal to change frequencies or deviate from the pattern. This switch point movement is often referred to as "jitter". Jitter may also be caused by momentary changes in the voltage range through which an output signal transitions. These momentary changes are often due to variations in the power supply voltages. For example, if the ground voltage changes due to switching currents and the other power supply voltage does not change similarly, the voltage range changes by the amount of the ground voltage change. An oscillator circuit which is insensitive to switching noise in the power supplies is desired insensitivity to switching noise is also referred to as having high "power supply rejection ratio".

SUMMARY OF THE INVENTION

The effects of jitter, as outlined above, are in large part solved by an oscillator circuit according to the present invention. The oscillator circuit includes a clamping transistor configured to limit the signal swing of an oscillator output terminal. The limited voltage swing allows relatively large movements in the power supply and ground voltages without causing significant changes in the frequency of oscillator output signals. Therefore, the oscillator circuit demonstrates a high power supply rejection ratio. Such an oscillator circuit is advantageously incorporated into an integrated circuit characterized by noisy power supply and ground conductors. The oscillator circuit would be characterized by relatively low jitter in such an environment, enhancing the speed of operation of the integrated circuit. Additionally, multiple output signals may be created using a level shifter circuit and a buffer circuit in each delay stage within the VCO. The level shifter shifts the limited voltage swing signal to a rail-to-rail signal and the buffer is capable of significant current flow so that a relatively large capacitive load may be driven. The output signal from each delay stage in the VCO is delayed from the previous delay stage's output signal. The multiple delayed versions of the output frequency on the output signals may be advantageously used throughout the mixed signal integrated circuit.

The oscillator circuit is relatively quick to react to changes in the controlling voltage, advantageously adjusting the oscillation frequency in a shorter time interval than previous voltage-controlled oscillators. Therefore, the oscillator may be used in high frequency applications with better results than may be achievable with other voltage-controlled oscillators.

The present invention contemplates an oscillator comprising a current source, a first transistor, a second transistor, and a clamping transistor. The first transistor is coupled between the current source and an output conductor and is configured with a first gate terminal connected to an input conductor. This first transistor is capable of charging the output conductor. The second transistor is coupled between the output conductor and a ground conductor and is configured with a second gate terminal connected to the input conductor. This second transistor is capable of discharging the output conductor. Coupled between the output conductor and the ground conductor is the clamping transistor, which is configured with a third gate terminal connected to the output conductor. The clamping transistor is capable of limiting an output voltage conveyed on the output conductor.

The present invention further contemplates a level shifter comprising at least four transistors. A first transistor is coupled between an output conductor and a ground conductor and is configured with a first gate terminal connected to a first input conductor. This first transistor is capable of discharging the output conductor. A second transistor is coupled between the output conductor and a power supply conductor and is configured with a second gate terminal connected to an internal conductor. The second transistor is capable of discharging the output conductor. Coupled between the internal conductor and the power supply conductor is a third transistor which is configured with a third gate terminal connected to the internal conductor. The third transistor is capable of charging the internal conductor. A fourth transistor is coupled between the internal conductor and the ground conductor and is configured with a fourth gate terminal connected to a second input conductor. The fourth transistor is capable of discharging the internal conductor.

The present invention still further contemplates a method of creating an output of an oscillator which is insensitive to power supply noise comprising limiting the voltage of the oscillator output to a voltage range between a ground voltage and a voltage less than a power supply voltage.

BRIEF DESCRIPTION OF THE DRAWINGS

Other objects and advantages of the invention will become apparent upon reading the following detailed description and upon reference to the accompanying drawings in which.

Figure 1:
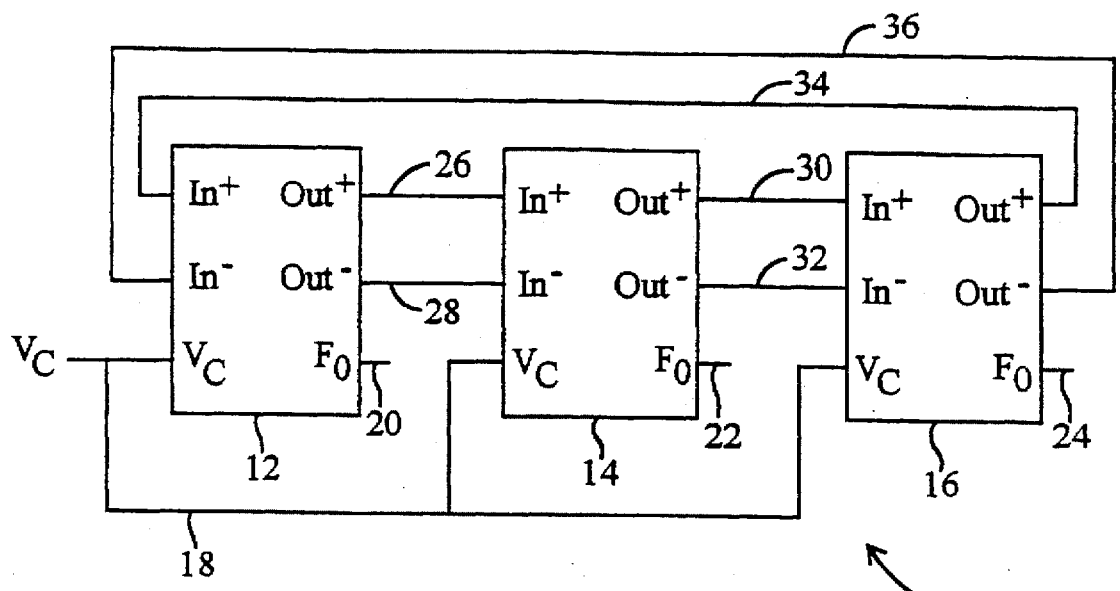
FIG. 1 is a block diagram of a voltage-controlled oscillator in accordance with the present invention having three delay stages.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
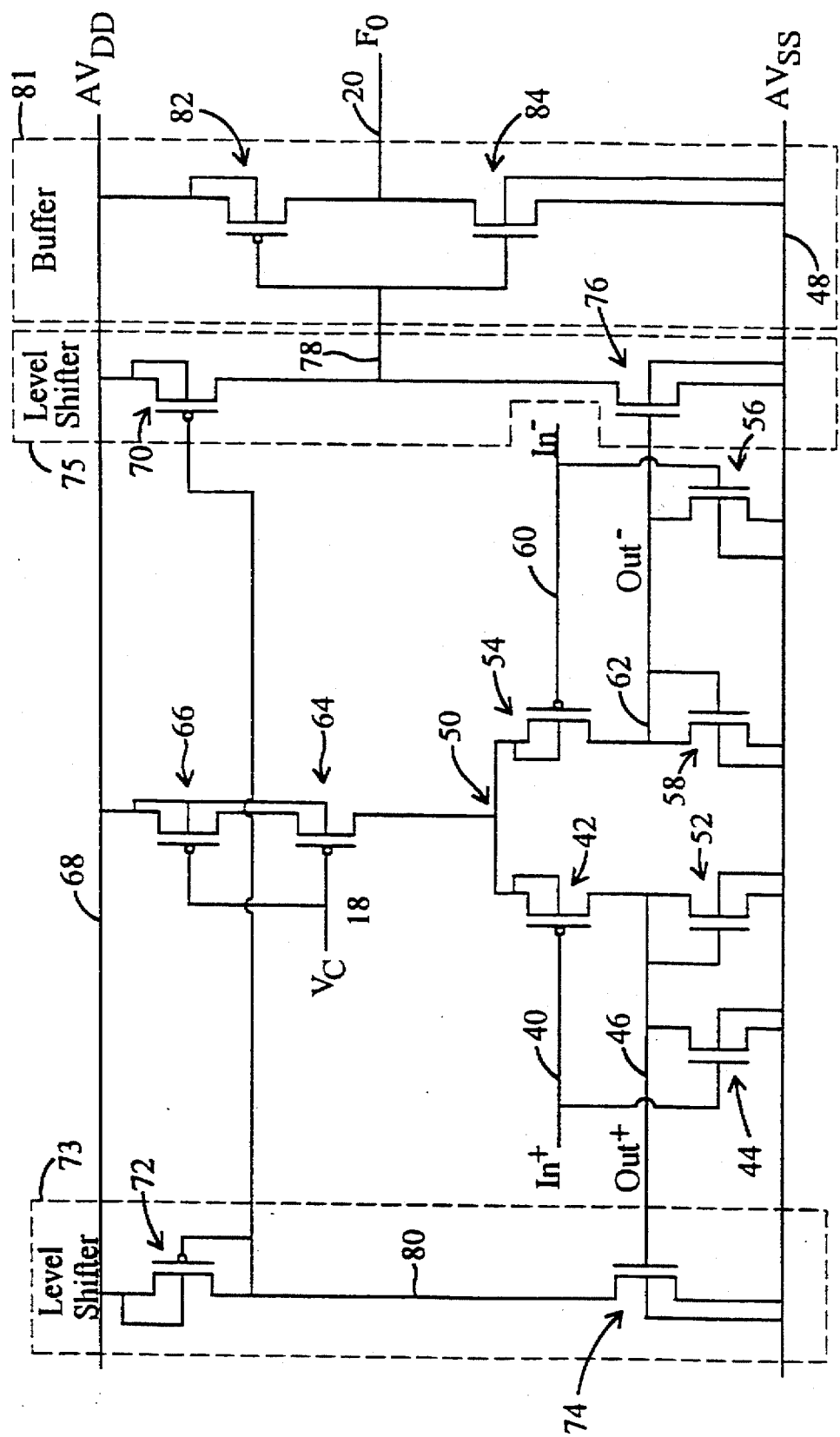
FIG. 3 is a circuit diagram of a delay stage in accordance with the present invention.

Turning now to FIG. 1, a block diagram of an embodiment of a voltage-controlled oscillator 10 is shown. This embodiment is configured with a first delay stage 12, a second delay stage 14, and a third delay stage 16. The delay stages are provided with an input control voltage (Vc) on a control voltage input conductor 18. The input control voltage is referenced to a power supply voltage delivered to the delay stages on a power supply conductor (as shown in FIG. 3 as power supply conductor 68). Each delay stage provides a substantially identical amount of delay between the switching of a differential pair of input signals and the switching of a differential pair of output signals. The amount of delay is determined by the control voltage. A "differential pair" of input or output signals are configured to convey a particular signal in opposite senses. One of the pair conveys the positive sense, and the other of the pair conveys the negative sense. As one signal of the pair is transitioning toward a high voltage, the other of the pair is transitioning toward a low voltage. The differential pair of input signals are conveyed to input terminals. The input terminals are labeled as In+ and In– on each delay stage. In+ is the input terminal receiving the positively sensed input signal, and In– is the terminal receiving the negatively sensed input signal. The differential pair of output terminals are labeled Out+ and Out– on each delay stage. Out+ is the output terminal conveying the positively sensed output signal, and Out– is the output terminal conveying the negatively sensed output signal.

In the embodiment shown in FIG. 1, the Out+ output terminal of first delay circuit 12 is coupled to the In+ input terminal of second delay circuit 14 via conductor 26. Similarly, the Out– output terminal of first delay circuit 12 is coupled to the In– input terminal of second delay circuit 14 via conductor 28. In a similar fashion, the Out+ and Out– output terminals of second delay circuit 14 are coupled to the In+ and In– input terminals of third delay circuit 16 via conductors 30 and 32, respectively. Finally, the Out+ and Out– output terminals of third delay circuit 16 are coupled to the In+ and In– input terminals of first delay circuit 12 via conductors 34 and 36, respectively.

Each of the delay stages of VCO 10 are inverting delay stages. That is, an Out+ output signal of a delay stage transitions to a high voltage when an In+ input signal of the delay stage transitions to a low voltage. Conversely, an Out+ output signal of the delay stage transitions to a low voltage when an In+ input signal of the delay stage transitions to a high voltage. Similar relationships exist between the In– input signal and the Out– output signal. Therefore, by coupling an odd number of delay stages such as shown in FIG. 1, an oscillation may be achieved. For example, if the In+ input signal of first delay stage 12 transitions high, the Out+ output signal of first delay stage 12 (and the In+ input signal of second delay stage 14) transitions low at a rate determined by Vc. Therefore, at a rate determined by Vc, the Out+ output signal of second delay stage 14 (and the In+ input signal of third delay stage 16) transitions high. The Out+ output signal of third delay stage 16 then transitions low at a rate determined by Vc. Therefore, the In+ input signal of first delay circuit 12 (which is coupled to the Out+ output signal of third delay circuit 16) transitions low as a result of its earlier transition high. Similarly, the transition to low of the In+ input signal of first delay circuit 12 will cause a future transition high of the In+ input signal of first delay circuit 12. VCO 10 therefore oscillates. For a given control voltage Vc, VCO 10 will oscillate at a particular frequency. It is noted that the In– input signal of each delay stage operates in a similar fashion but in opposite sense of the In+ input signal of that delay stage. Similarly, the Out– output signal of each delay stage operates in a similar fashion but in opposite sense of the respective delay stage's Out+ output signal.

As will be explained in more detail with respect to FIG. 3, the In+, In–, Out+, and Out– signals are "limited swing" signals. As used herein, the term "limited swing" signals refers to signals which assume voltage levels in a limited range of voltages encompassed between the power supply voltage level and ground voltage level supplied to the delay stages. In one embodiment, the limited swing of VCO 10 is a range of voltages from ground to a small delta above ground. However, VCO 10 is designed for an integrated circuit with digital circuitry. Digital circuits interpret a power supply voltage as a logical one value and a ground voltage as a logical zero value. Other values do not have defined meanings in digital circuits. Therefore, an output signal which swings completely to the power supply voltage and the ground voltage (i.e. "rail-to-rail") is needed. The embodiment of FIG. 1 has three outputs that swing from rail-to-rail, one from each delay stage. These outputs are labeled Fo on each delay stage. First delay stage 12 has a first Fo output conductor 20, second delay stage 14 includes a second Fo output conductor 22, and third delay stage 16 includes a third Fo output conductor 24. Either first Fo output conductor 20, second Fo output conductor 22, or third Fo output conductor 24 is used as a clock input to various digital circuits on an integrated circuit with VCO 10. Alternatively, two or more of the Fo output conductors 20, 22, and 24 may be used.

Figure 2:
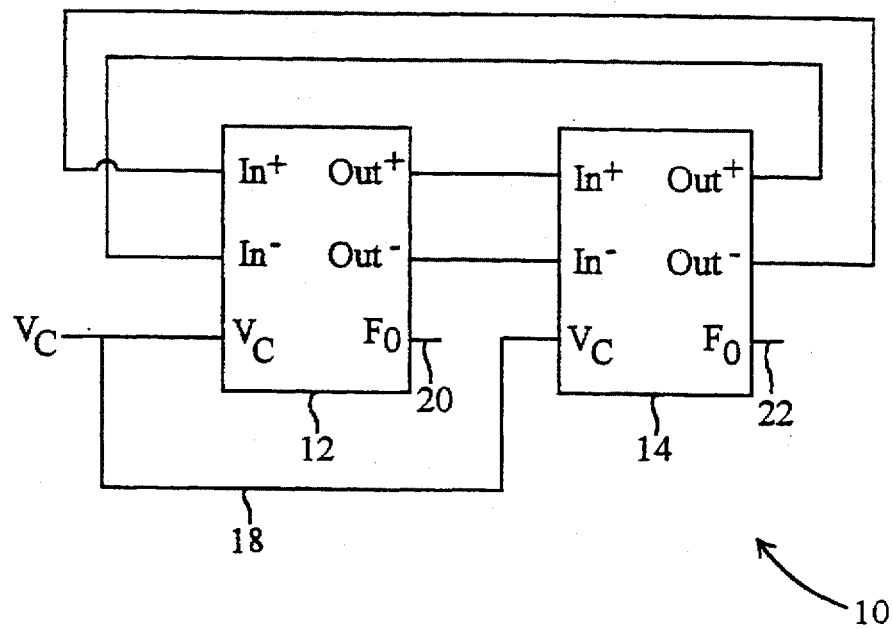
FIG. 2 is a block diagram of a voltage-controlled oscillator in accordance with the present invention having two delay stages.

It is noted that any odd number of delay stages may be coupled similar to that shown in FIG. 1 to form a VCO 10. It is further noted that an even number of delay stages may be used. In embodiments having an even number of delay stages, the Out– output terminal of the last delay stage is coupled to the In+ input terminal of the first delay stage. Additionally, the Out+ output terminal of the last delay stage of the even number of delay stages is coupled to the In– input terminal of the first delay stage. A configuration of VCO 10 with two delay stages 12 and 14 is shown in FIG. 2.

Turning now to FIG. 3, an embodiment of first delay circuit 12 is shown. Second delay circuit 14 and third delay circuit 16 are substantially identical to first delay circuit 12. In+ terminal 40 is shown coupled to the gate terminals of two transistors: PMOS transistor 42 and NMOS transistor 44. NMOS transistor 44 is coupled between Out+ terminal 46 and ground conductor 48. Ground conductor 48 is powered, during use, with a ground voltage. PMOS transistor 42 is coupled between Out+ terminal 46 and node 50. Also coupled between Out+ terminal 46 and ground conductor 48 is NMOS transistor 52. NMOS transistor 52 has a gate terminal connected to Out+ terminal 46, and serves to clamp the voltage on Out+ terminal 46 when PMOS transistor 42 is charging Out+ terminal When the voltage on In+ terminal 40 transitions toward ground, current flows through PMOS transistor 42, charging Out+ terminal 46. Current flow through NMOS transistor 44 reduces and substantially stops as the voltage on In+ terminal 40 transitions to ground voltage. As the voltage on Out+ terminal 46 rises, the voltage difference between the gate and source terminals of NMOS transistor 52 exceeds a threshold voltage and NMOS transistor 52 begins current flow. The voltage on Out+ terminal 46 continues increasing until the current flowing through NMOS transistor 52 substantially equals the current flowing through PMOS transistor 42. At this point, the voltage on Out+ terminal 46 ceases increasing. Therefore, NMOS transistor 52 has clamped the voltage on Out+ terminal 46.

When the voltage on In+ terminal 40 transitions toward a power supply voltage conveyed on a power supply conductor 68, PMOS transistor 42 substantially ceases current flow and NMOS transistor 44 discharges Out+ terminal 46 to the ground voltage. Out+ terminal 46 therefore conveys voltages between ground and the clamped voltage value (which is greater than ground). As will be appreciated by one skilled in the art, the function of PMOS transistor 54, NMOS transistor 56, NMOS transistor 58, In– terminal 60, and Out– terminal 62 is similar to PMOS transistor 42, NMOS transistor 44, NMOS transistor 52, In+ terminal 40, and Out+ terminal 46, respectively.

It is noted that PMOS transistors 42 and 54 are configured with bulk terminal connections to node 50. Other transistors in first delay circuit 12 have the standard bulk connections to power supply conductor 68 (for PMOS transistors) or ground conductor 48 (for NMOS transistors). This bulk connection is used for PMOS transistors 42 and 54 to prevent what is often referred to as body effect. Body effect occurs when the voltage on the source terminal of a transistor is different than the voltage on the bulk connection. Body effect causes the current capability of a transistor to degrade. By connecting the bulk to the source, the voltage difference (and therefore body effect) is eliminated.

First delay circuit 12 is further configured with a voltage-controlled current source comprised of PMOS transistors 64 and 66. A voltage-controlled current source supplies current proportional to an input voltage. PMOS transistors 64 and 66 are connected in series and are coupled between power supply conductor 68 and node 50. The gate terminals of both PMOS transistor 64 and PMOS transistor 66 are coupled to control voltage input conductor 18. Therefore, PMOS transistors 64 and 66 control the amount of current available to PMOS transistor 42 and PMOS transistor 54. That is, PMOS transistors 64 and 66 (and therefore the voltage conveyed on control voltage input conductor 18) control the rate at which Out+ terminal 46 and/or Out− terminal 62 are charged and discharged. The delay from the switching of the differential input pair of the In+ and In− input terminals to the switching of the differential output pair of the Out+ and Out− output signals is therefore controlled by the voltage conveyed on control voltage input conductor 18. Furthermore, when first delay circuit 12 and similarly configured second delay circuit 14 and third delay circuit 16 are configured into VCO 10, the oscillation frequency of VCO 10 is controlled by the voltage conveyed on control voltage input conductor 18.

The current source formed by PMOS transistors 64 and 66 is considerably simpler than typical current sources which may involve an operational amplifier in a unity gain configuration with a sense resistor and a current mirror circuit. Hence, the present current source may be implemented in a smaller silicon area. Since the present configuration uses fewer transistors, the current source shown in FIG. 3 consumes less power than conventional current sources. Furthermore, operational amplifiers are low bandwidth devices due to the resistive/capacitive compensation that they require. Therefore, operational amplifiers are slow to react to changes in the control voltage. In contrast, the current source shown in FIG. 3 reacts much faster. The reaction time is proportional to the operational speed of PMOS transistors 64 and 66. Additionally, since the control voltage on control voltage input conductor 18 is referenced to the power supply voltage on power supply conductor 68, the control voltage is relatively constant with respect to the power supply voltage. Therefore, the current through PMOS transistors 64 and 66 is relatively constant with respect to changes in the power supply voltage. Since the current through PMOS transistors 64 and 66 controls the output frequency of delay stage 12, the delay stage has a high power supply rejection ratio with respect to its output frequency.

The advantages of the circuit shown in FIG. 3 may be better understood with reference to the following basic equation for capacitive charging:

$$I = C\, dv/dt$$

Out+ terminal 46 and Out− terminal 62 are coupled to substantially capacitive "loads". As used herein, the term "load" refers to electrical devices which are connected to an output of a circuit such that the electrical devices receive the current and voltage values placed on the output by the circuit. Through PMOS transistors 64 and 66, the current available for charging the Out+ and Out− output terminals is fixed for a given value of Vc (referenced to the power supply voltage). The capacitance (C in the equation above) is substantially fixed, although slight variations occur due to variance in P-N junction capacitances within the transistors. Therefore, the rate of change of the voltage (dv/dt in the above equation) is fixed as long as the voltage swing range is constant. If the voltage were allowed to swing between the ground voltage and the power supply voltage, then the voltage swing would not be constant due to the switching noise on the power supplies causing variations in the voltage range. However, NMOS transistors 52 and 58 clamp the voltage swing to a smaller fixed range than the full ground-to-power supply range (also referred to as the rail-to-rail voltage swing).

Furthermore, the circuit of FIG. 3 is configured with a relatively small number of transistors. Therefore, the circuit may be implemented on a small area and the various ground conductor and power supply conductor connections may be physically quite close to each other. Connecting the ground and power supply connections close to each other minimizes the substrate voltage difference problem, which is magnified by larger distances between connections. Additionally, the small number of transistors allows for easier matching from delay stage to delay stage on an integrated circuit such that a substantially similar delay is achieved by each delay stage. The term "matching" refers to achieving similar current characteristics in a pair of transistors. The smaller number of transistors additionally contributes to lower power consumption than more complicated circuits. As will be appreciated by those skilled in the art, prior VCO's often implemented complicated circuits such as op-amps, bandgap voltage references, current references, and comparators. The circuit of FIG. 3 does not implement such circuits.

First delay circuit 12 is additionally configured with a level shifter circuit. The level shifter circuit is indicated in FIG. 3 by boxes 73 and 75, and is formed in this embodiment by PMOS transistors 70 and 72 and NMOS transistors 74 and 76. A level shifter circuit is a circuit which shifts input voltages within an input range of voltages to output voltages within an output range of voltages. The level shifter circuit shown in FIG. 3 is configured to shift the limited voltage swing signals on Out+ terminal 46 and Out− terminal 62 into a rail-to-rail voltage swing signal on a conductor 78. In particular, a voltage on Out+ terminal 46 at the top of the limited voltage swing range and a corresponding ground voltage on Out− terminal 62 is shifted into a power supply voltage on conductor 78. Additionally, a ground voltage on Out+ terminal 46 and a corresponding voltage on Out− terminal 62 at the top of the limited voltage swing range is shifted into a ground voltage on conductor 78. Each of these cases will be explained in more detail below. It is noted that voltages within the limited voltage swing range associated with Out+ terminal 46 and Out− terminal 62 are shifted into intermediate voltages between the power supply voltage and the ground voltage.

As can be seen in FIG. 3, PMOS transistor 70 is coupled between power supply conductor 68 and conductor 78 with its gate terminal coupled to an internal conductor 80. PMOS transistor 72 is coupled between power supply conductor 68 and internal conductor 80 with its gate terminal similarly coupled to internal conductor 80. Coupled between internal conductor 80 and ground conductor 48 is NMOS transistor 74 which has its gate terminal coupled to Out+ terminal 46.

NMOS transistor 76 is coupled between conductor 78 and ground conductor 48 with its gate terminal coupled to Out– terminal 62.

In the case in which Out+ terminal 46 is conveying a relatively high voltage level and Out– terminal 62 is conveying a ground voltage level, NMOS transistor 76 does not conduct current and NMOS transistor 74 does conduct current. NMOS transistor 74 discharges internal conductor 80, decreasing the voltage level on the gate terminals of PMOS transistors 72 and 70. When the voltage difference between the gate terminals and source terminals of PMOS transistors 72 and 70 exceeds a threshold voltage, PMOS transistors 72 and 70 conduct current. Since NMOS transistor 76 is not conducting current, PMOS transistor 70 charges conductor 78 to the power supply voltage conveyed on power supply conductor 68.

As Out+ terminal 46 transitions to a ground voltage and Out– terminal 62 transitions to a relatively high voltage, the current flow through NMOS transistor 74 reduces and substantially stops. PMOS transistor 72 charges internal conductor 80 to within a threshold voltage difference of the power supply voltage conveyed on power supply conductor 68. Therefore, current flow through PMOS transistor 72 and PMOS transistor 70 substantially stops. Concurrently, current flow through NMOS transistor 76 is increasing due to the voltage on Out– terminal 62. NMOS transistor 76 therefore discharges conductor 78. Conductor 78 is discharged to a ground voltage level.

An output buffer circuit (indicated by box 81 on FIG. 3) is coupled to conductor 78. The buffer circuit comprises an inverter circuit with PMOS transistor 82 and NMOS transistor 84. PMOS transistor 82 and NMOS transistor 84 are typically larger than other transistors in first delay circuit 12 and therefore have more current capability than the other transistors. PMOS transistor 82 and NMOS transistor 84 are better equipped to charge and discharge the large capacitive loads that may be connected to Fo output conductor 20.

It is noted that the level shifter circuit and output buffer circuit are used to provide the rail-to-rail clock signal Fo on Fo output conductor 20. If this rail-to-rail clock signal is not used from a particular delay stage in an embodiment of VCO 10, then the level shifter circuit and output buffer circuit may be removed from that stage. It is further noted that the circuit shown in FIG. 3 is configured for an N-well process in a P-well process, a similar circuit is contemplated. Additionally, similar circuits fabricated in other semiconductor fabrication processes are contemplated. Specifically contemplated are circuits fabricated in bipolar, JFET, and gallium arsenide semiconductor fabrication processes.

In accordance with the above disclosure, a high speed oscillator circuit has been described with a high power supply rejection ratio. Such an oscillator may be advantageously incorporated into a mixed signal integrated circuit. Low jitter values may be achieved, enhancing the speed of operation of the integrated circuit. Additionally, multiple delayed versions of the output frequency may be created which may be advantageously used throughout the mixed signal integrated circuit. Furthermore, the oscillator circuit is quick to react to changes in the controlling voltage, advantageously adjusting the oscillation frequency in a shorter time interval than previous voltage-controlled oscillators.

Numerous variations and modifications will become apparent to those skilled in the art once the above disclosure is fully appreciated. It is intended that the following claims be interpreted to embrace all such variations and modifications.

What is claimed is:

1. A level shifter for a voltage controlled oscillator comprising:

a first pulldown transistor coupled between an output conductor and a ground conductor wherein said first pulldown transistor is configured with a first gate terminal connected to receive a first input signal of said level shifter and wherein said first pulldown transistor is capable of discharging said output conductor;

a first pullup transistor coupled between said output conductor and a power supply conductor wherein said first pullup transistor is configured with a second gate terminal connected to an internal conductor and wherein said first pullup transistor is capable of charging said output conductor;

a second pullup transistor coupled between said internal conductor and said power supply conductor wherein said second pullup transistor is configured with a third gate terminal connected to said internal conductor and wherein said second pullup transistor is capable of charging said internal conductor; and a second pulldown transistor coupled between said internal conductor and said ground conductor wherein said second pulldown transistor is configured with a fourth gate terminal connected to receive a second input signal of said level shifter and wherein said second pulldown transistor is capable of discharging said internal conductor;

wherein said voltage controlled oscillator is configured to provide said first input signal and said second input signal to said level shifter, and wherein said voltage controlled oscillator includes a first clamping transistor coupled between said ground conductor and said first gate terminal, and wherein said first clamping transistor includes a fifth gate terminal coupled to said first gate terminal, and wherein said voltage controlled oscillator further includes a second clamping transistor coupled between said ground conductor and said fourth gate terminal, and wherein said second clamping transistor includes a sixth gate terminal coupled to said fourth gate terminal, whereby a range of said first input signal and said second input signal is limited between a ground voltage upon said ground conductor during use and a second voltage less than a power supply voltage upon said power supply conductor during use.

2. The level shifter as recited in claim 1 wherein said first pulldown transistor is an NMOS transistor.

3. The level shifter as recited in claim 1 wherein said first pullup transistor is a PMOS transistor.

4. The level shifter as recited in claim 1 wherein said second pullup transistor is a PMOS transistor.

5. The level shifter as recited in claim 1 wherein said second pulldown transistor is an NMOS transistor.

6. The level shifter as recited in claim 1 further comprising a buffer circuit coupled to said output conductor for providing greater charging capability for a load.

7. The level shifter as recited in claim 6 wherein said buffer circuit comprises an inverter circuit.

\* \* \* \* \*